United States Patent
Matsuo et al.

(10) Patent No.: US 10,854,466 B2
(45) Date of Patent: Dec. 1, 2020

(54) ETCHING METHOD, METHOD OF MANUFACTURING SEMICONDUCTOR CHIP, AND METHOD OF MANUFACTURING ARTICLE

(71) Applicant: KABUSHIKI KAISHA TOSHIBA, Minato-ku (JP)

(72) Inventors: Keiichiro Matsuo, Yokohama (JP); Susumu Obata, Yokohama (JP); Mitsuo Sano, Yokohama (JP); Kazuhito Higuchi, Yokohama (JP); Kazuo Shimokawa, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/267,456

(22) Filed: Feb. 5, 2019

(65) Prior Publication Data

US 2019/0252199 A1    Aug. 15, 2019

(30) Foreign Application Priority Data

Feb. 9, 2018 (JP) ................................. 2018-021849

(51) Int. Cl.
| | | |
|---|---|---|
| H01L 21/308 | (2006.01) | |
| H01L 21/768 | (2006.01) | |
| H01L 21/033 | (2006.01) | |

(52) U.S. Cl.
CPC ...... *H01L 21/3086* (2013.01); *H01L 21/0332* (2013.01); *H01L 21/0337* (2013.01); *H01L 21/3081* (2013.01); *H01L 21/76873* (2013.01)

(58) Field of Classification Search
CPC .................................................. H01L 21/3086
See application file for complete search history.

(56) References Cited

U.S. PATENT DOCUMENTS

| | | | |
|---|---|---|---|
| 10,090,158 B2 | 10/2018 | Matsuo et al. | |
| 10,163,713 B2 | 12/2018 | Lei et al. | |
| 2010/0041237 A1 | 2/2010 | Lee et al. | |
| 2014/0335411 A1 | 11/2014 | Liu et al. | |
| 2015/0130028 A1* | 5/2015 | Asano ................... | H01L 23/544 |
| | | | 257/620 |
| 2016/0240421 A1 | 8/2016 | Chang et al. | |
| 2018/0211849 A1 | 7/2018 | Kobata et al. | |

FOREIGN PATENT DOCUMENTS

| | | |
|---|---|---|
| CN | 104900509 A | 9/2015 |
| JP | 2000-306858 | 11/2000 |
| JP | 2010-506385 | 2/2010 |
| JP | 2015-057840 | 3/2015 |
| JP | 2015-509283 | 3/2015 |
| JP | 2016-152414 | 8/2016 |
| JP | 2017-118145 | 6/2017 |
| JP | 2018-018965 | 2/2018 |
| TW | 201631648 A | 9/2016 |
| TW | 201705259 A | 2/2017 |

* cited by examiner

*Primary Examiner* — Roberts P Culbert
(74) *Attorney, Agent, or Firm* — Oblon, McClelland, Maier & Neustadt, L.L.P.

(57) ABSTRACT

An etching method according to an embodiment includes forming an uneven structure including a projection on a surface of a semiconductor substrate; forming a catalyst layer including a noble metal on the surface selectively at a top surface of the projection; and supplying an etchant to the catalyst layer to cause an etching of the semiconductor substrate with an assist from the noble metal as a catalyst.

15 Claims, 15 Drawing Sheets

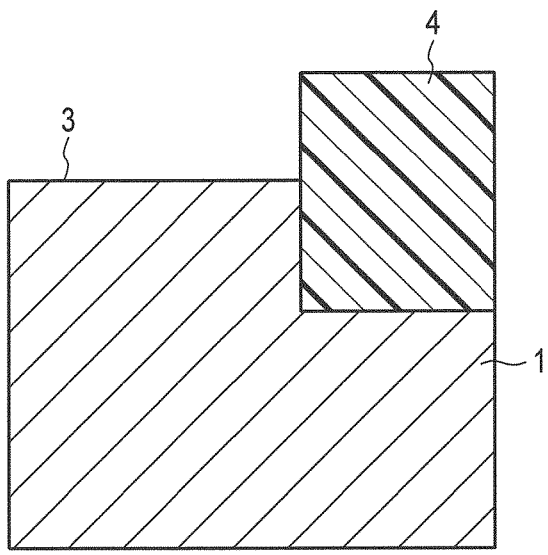
F I G. 11
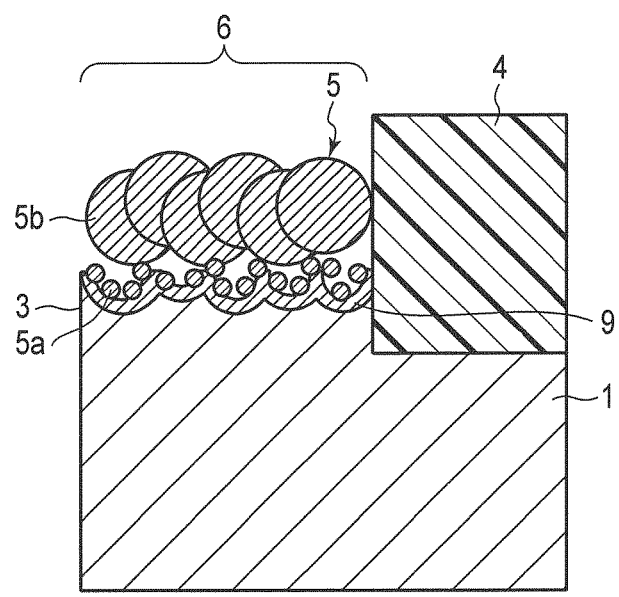
F I G. 12

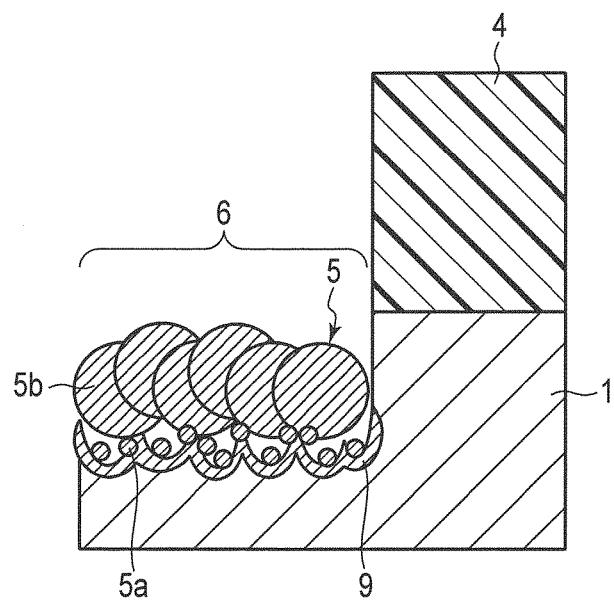
F I G. 13
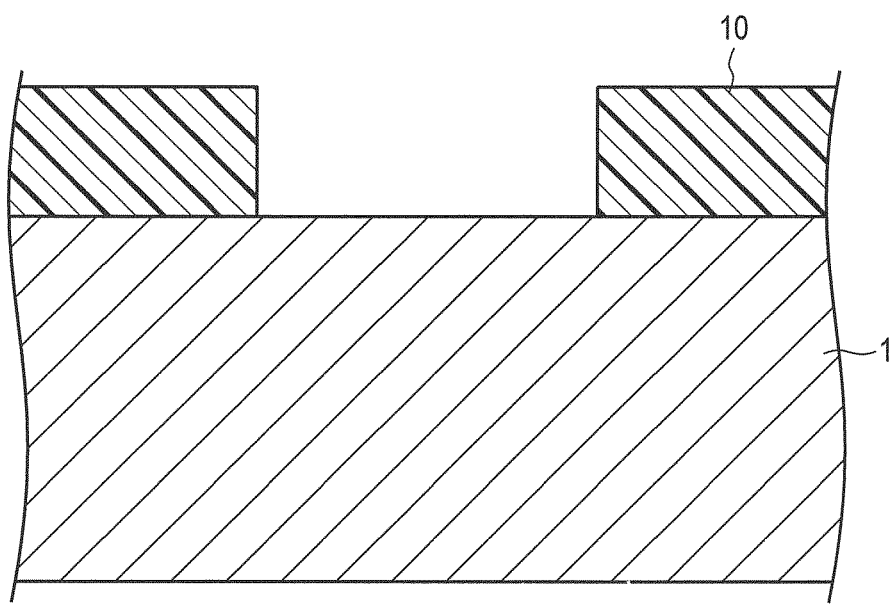
F I G. 14

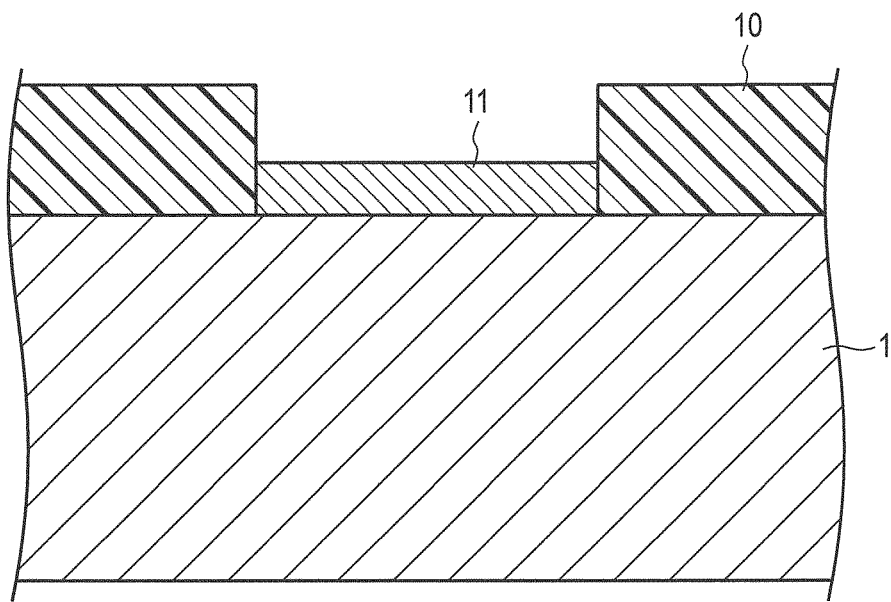
F I G. 15
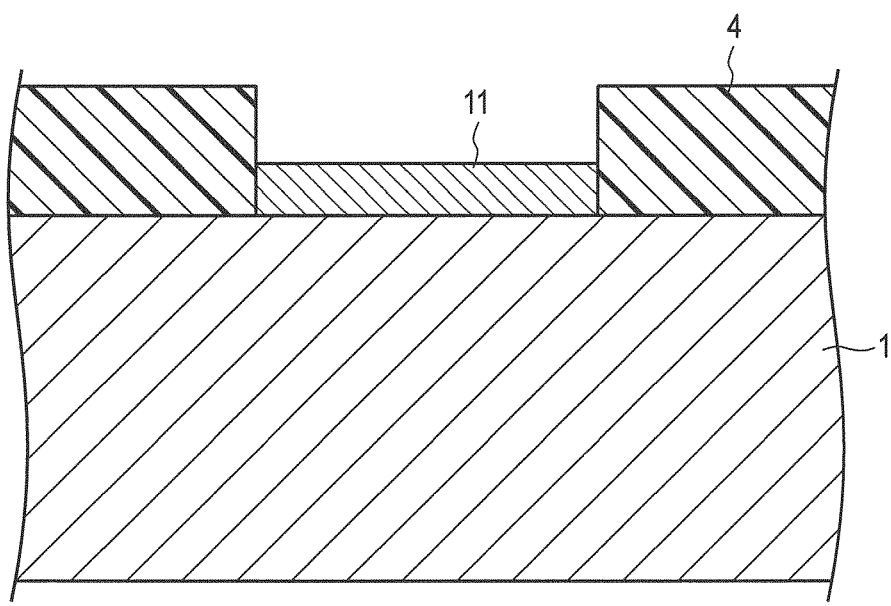
F I G. 16

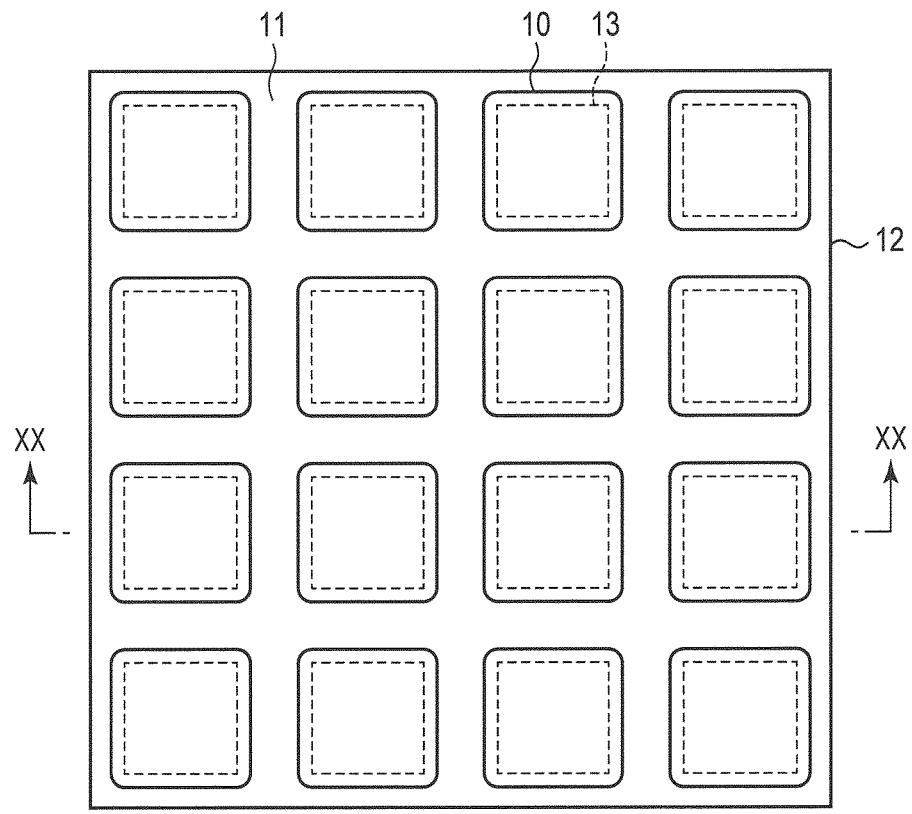
F I G. 19
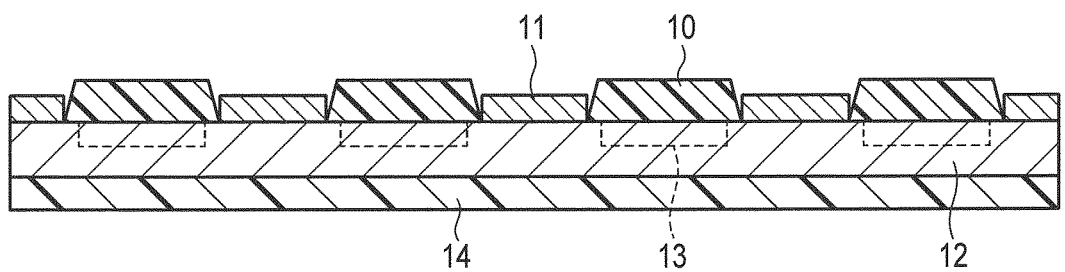
F I G. 20

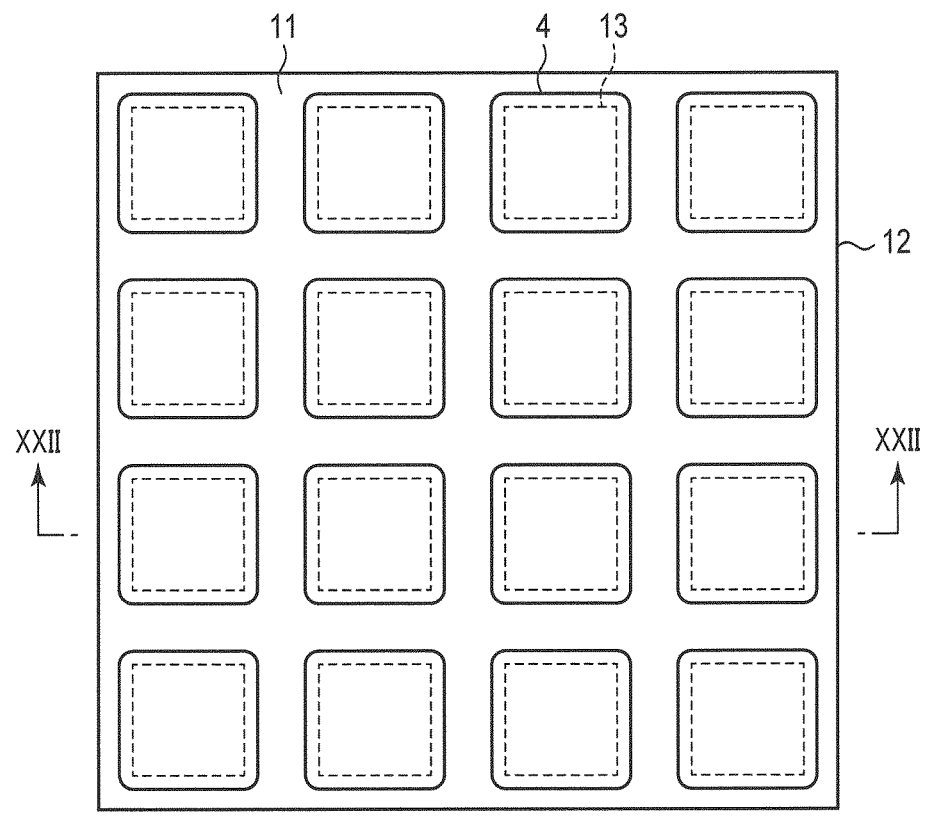
F I G. 21
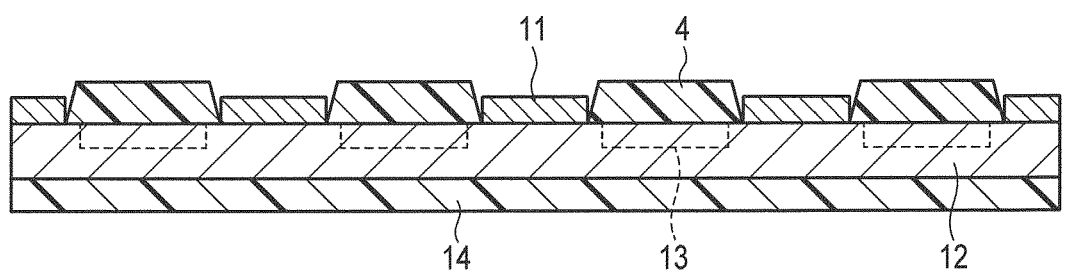
F I G. 22

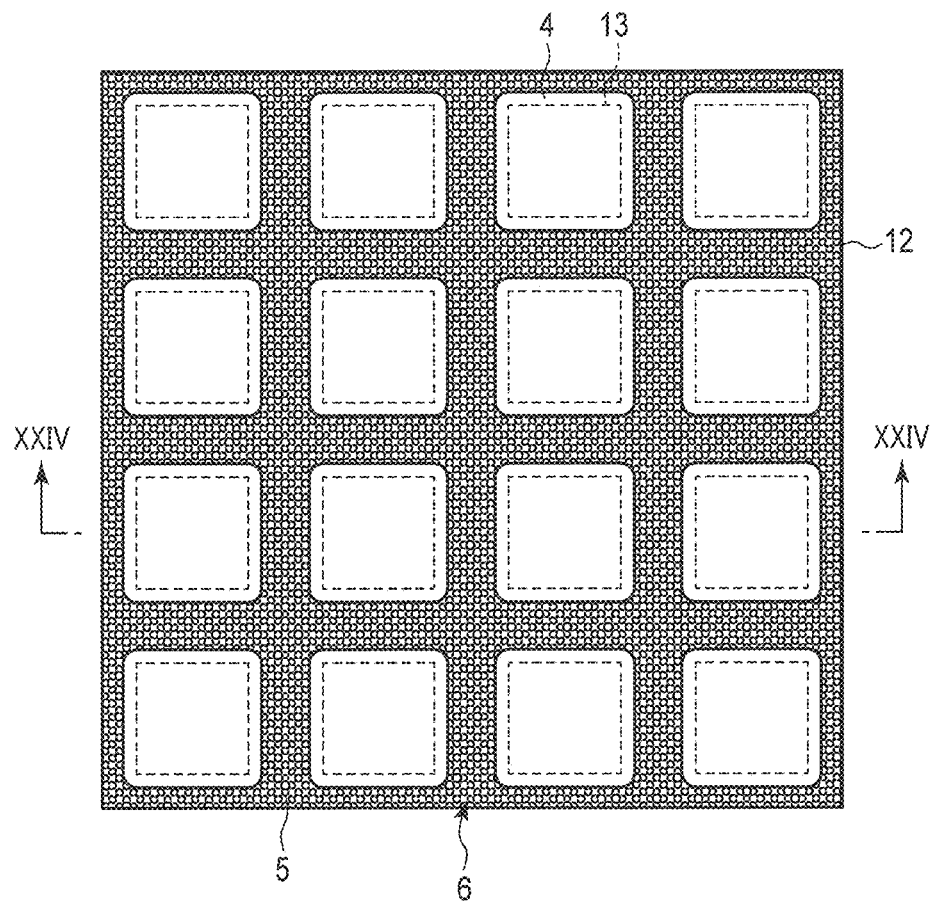
F I G. 23
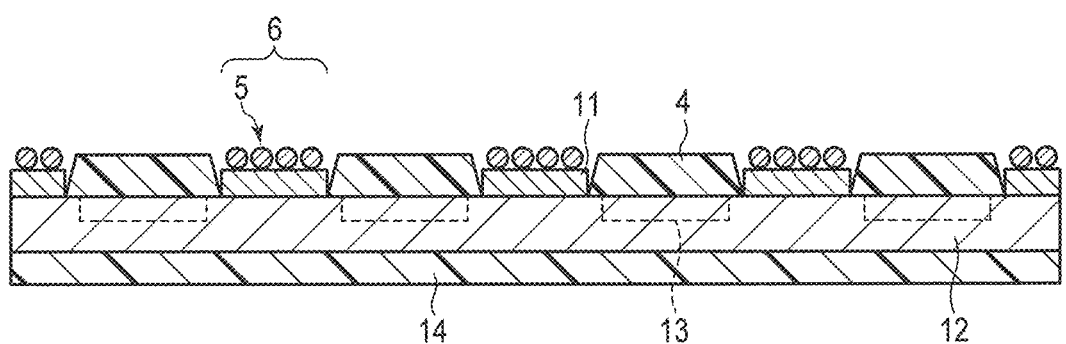
F I G. 24

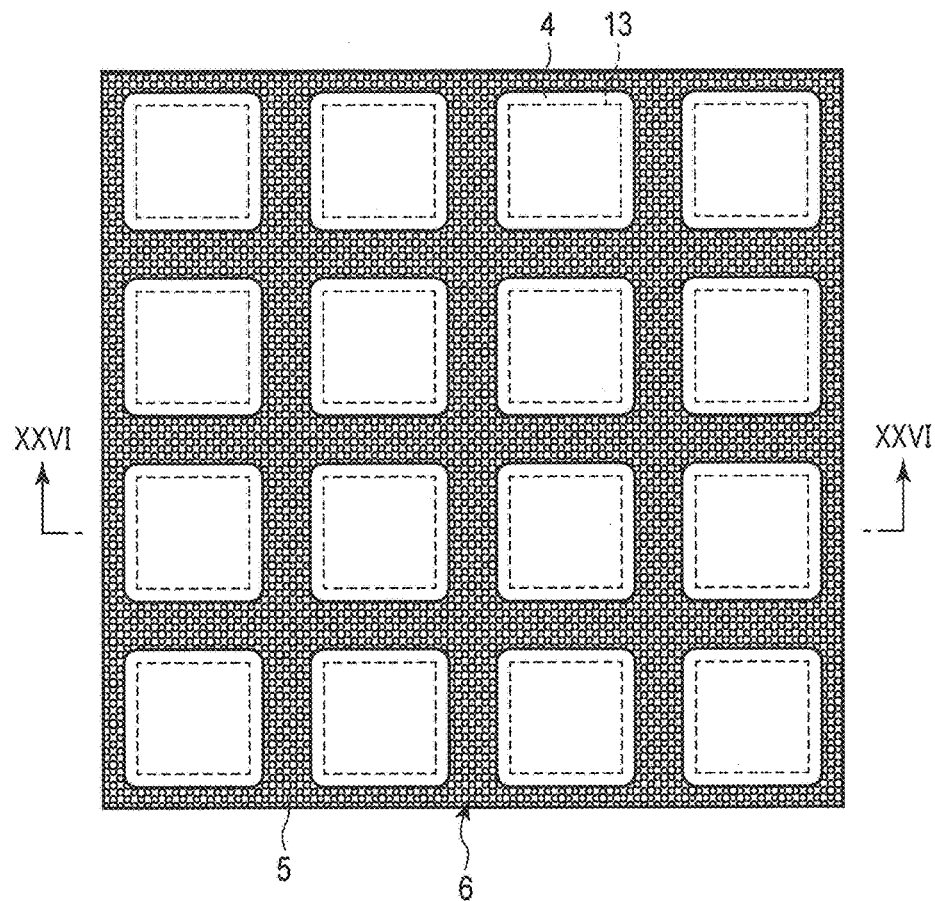
F I G. 25
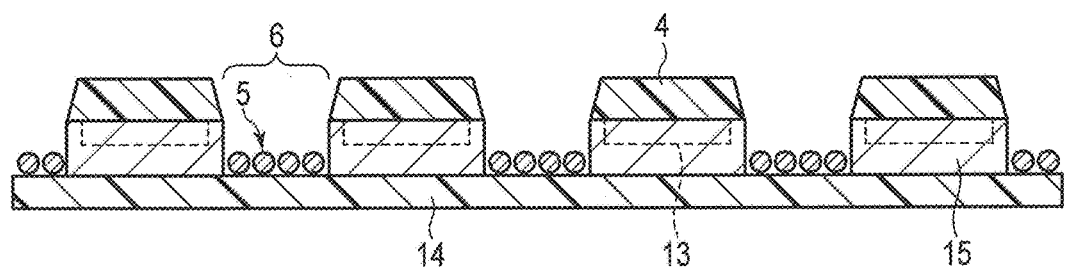
F I G. 26

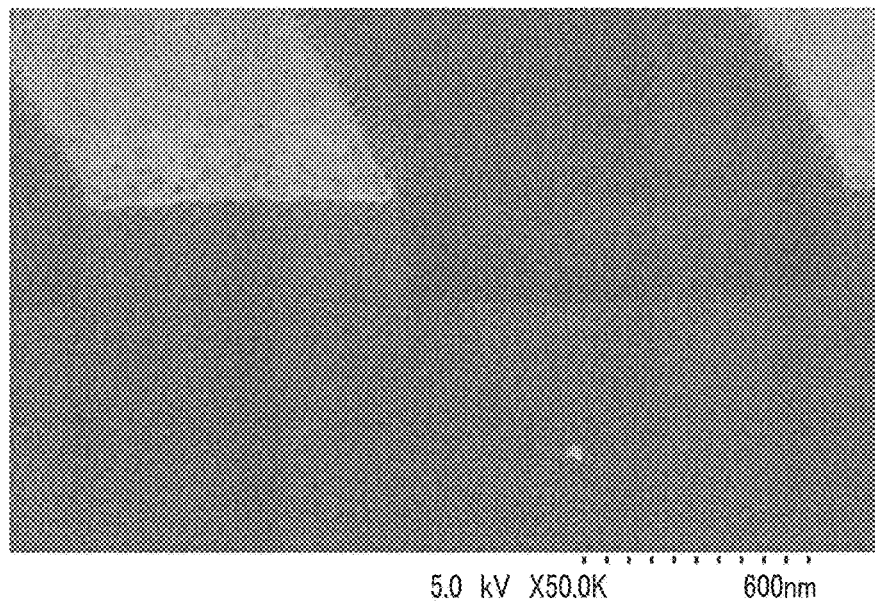
F I G. 27
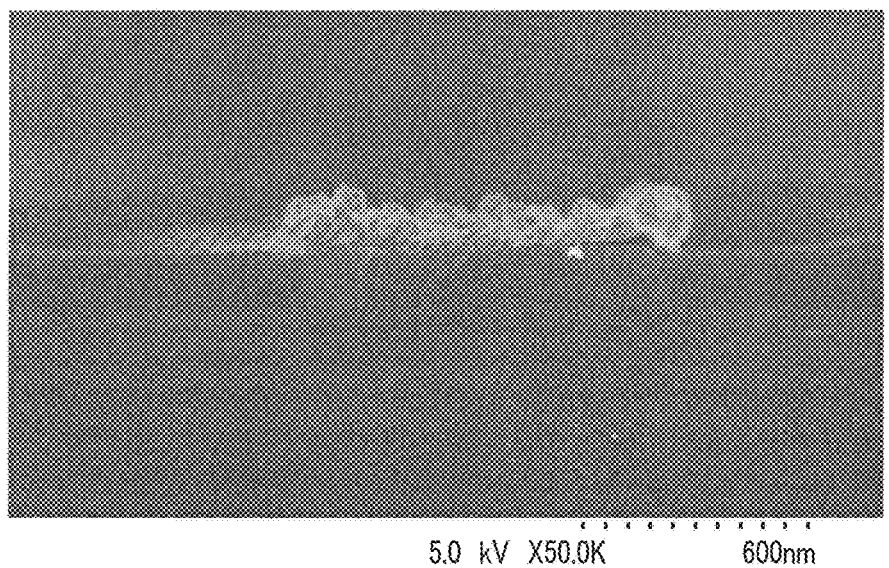
F I G. 28

ETCHING METHOD, METHOD OF MANUFACTURING SEMICONDUCTOR CHIP, AND METHOD OF MANUFACTURING ARTICLE

CROSS-REFERENCE TO RELATED APPLICATION

This application is based upon and claims the benefit of priority from prior Japanese Patent Application No. 2018-021849, filed Feb. 9, 2018, the entire contents of which are incorporated herein by reference.

FIELD

Embodiments described herein relate generally to an etching method, a method of manufacturing a semiconductor chip, and a method of manufacturing an article.

BACKGROUND

Etching is known as a method of forming a hole and a groove in a semiconductor wafer.

As an etching method, for example, a method of plasma-etching a semiconductor wafer includes forming a mask layer on the semiconductor wafer, patterning the mask layer by laser scribing and using the patterned mask layer as an etching mask is known.

As another etching method, metal-assisted chemical etching (MacEtch) is known. The MacEtch is, for example, a method of etching a semiconductor substrate containing silicon using a noble metal as a catalyst.

BRIEF DESCRIPTION OF THE DRAWINGS

FIG. 11 is a sectional view schematically showing a semiconductor substrate to be etched in the etching method according to the embodiment;

FIG. 12 is a sectional view schematically showing a step of forming a catalyst layer in the etching method according to the embodiment;

FIG. 13 is a sectional view schematically showing an etching step in the etching method according to the embodiment;

FIG. 14 is a sectional view schematically showing a step of forming a second mask layer in an etching method according to another embodiment;

FIG. 15 is a sectional view schematically showing a step of forming a semiconductor layer in an etching method according to another embodiment;

FIG. 16 is a sectional view schematically showing a step of forming a third mask layer in an etching method according to another embodiment;

FIG. 19 is a plan view schematically showing a step of forming a semiconductor layer in the semiconductor chip manufacturing method according to the embodiment;

FIG. 20 is a sectional view of the semiconductor wafer, taken along a line XX-XX shown in FIG. 19;

FIG. 21 is a plan view schematically showing a step of forming a third mask layer in the semiconductor chip manufacturing method according to the embodiment;

FIG. 22 is a sectional view of the semiconductor wafer, taken along a line XXII-XXII shown in FIG. 21;

FIG. 23 is a plan view schematically showing a step of forming a catalyst layer in the semiconductor chip manufacturing method according to the embodiment;

FIG. 24 is a sectional view of the semiconductor wafer, taken along a line XXIV-XXIV shown in FIG. 23;

FIG. 25 is a plan view schematically showing an example of a structure obtained by the method shown in FIGS. 17 to 24;

FIG. 26 is a sectional view of the semiconductor wafer, taken along a line XXVI-XXVI shown in FIG. 25;

FIG. 27 is a micrograph showing a section of a semiconductor wafer on which a projection and a third mask layer are formed;

FIG. 28 is a micrograph showing a section of a structure obtained by forming a catalyst layer on the structure shown in FIG. 27;

DETAILED DESCRIPTION

Figure 1:
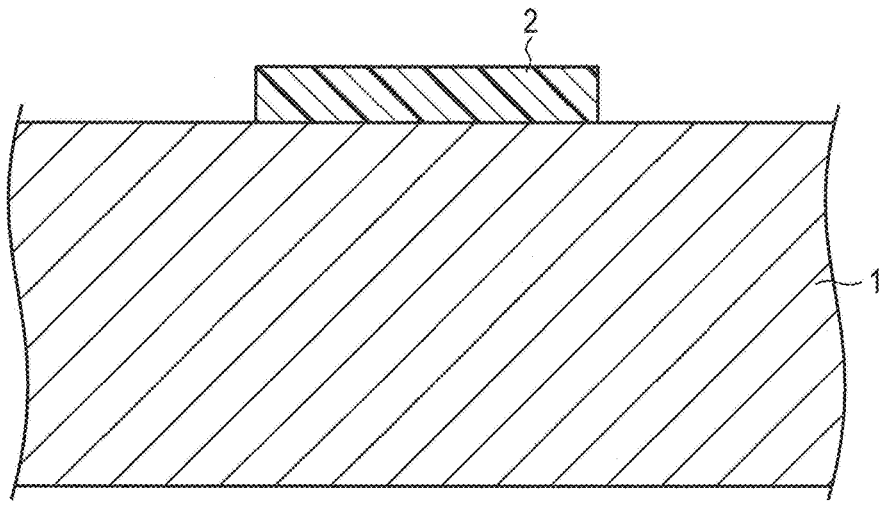
FIG. 1 is a sectional view schematically showing a step of forming a first mask layer in an etching method according to an embodiment.

An etching method according to the first embodiment comprises forming an uneven structure including a projection on a surface of a semiconductor substrate; forming a catalyst layer including a noble metal on the surface selectively at a top surface of the projection; and supplying an etchant to the catalyst layer to cause an etching of the semiconductor substrate with an assist from the noble, metal as a catalyst.

A method of manufacturing a semiconductor chip according to the second embodiment comprises etching a semiconductor wafer by the etching method according to the first embodiment to singulate the semiconductor wafer into semiconductor chips, the surface being a surface of the semiconductor wafer.

A method of manufacturing an article according to the third embodiment comprises etching the surface by the etching method according to the first embodiment.

Embodiments will be explained in detail below with reference to the accompanying drawings. Note that the same reference numerals denote constituent elements which achieve the same or similar functions throughout all the drawings, and a repetitive explanation will be omitted. In this specification, "micrograph" is scanning electron micrograph.

First, an etching method according to an embodiment will be described with reference to FIGS. 1 to 7.

In the etching method, first, a semiconductor substrate 1 is prepared as shown in FIG. 1.

At least a part of the surface of the semiconductor substrate 1 is made of a semiconductor. The semiconductor is, for example, selected from silicon (Si), germanium (Ge), semiconductor comprising compounds of group-III and group-V elements such as gallium arsenide (GaAs) and gallium nitride (GaN), silicon carbide (SiC), and the like. As one example, the semiconductor substrate 1 contains silicon. Note that the term "group" herein used is "a group" in the short-form periodic table.

The semiconductor substrate 1 is, for example, a semiconductor wafer. The semiconductor wafer can be doped with impurities, or semiconductor elements such as transistors or diodes can be formed on the semiconductor wafer. Also, the principal surface of the semiconductor wafer can be parallel to any crystal plane of the semiconductor.

Then, a first mask layer 2 is formed on the surface of the semiconductor substrate 1, as shown in FIG. 1.

The first mask layer 2 is a layer for forming a projection (described later) on the surface of the semiconductor substrate 1. The first mask layer 2 has one or more openings.

Any material can be used as the material of the first mask layer 2, provided that the material can protect a region of the surface of the semiconductor substrate 1 which is covered with the first mask layer 2 from etching. Examples of the material include organic materials such as polyimide, a fluorine resin, a phenolic resin, an acrylic resin and a novolak resin.

The first mask layer 2 can be formed by, for example, the existing semiconductor processes. The first mask layer 2 made of an organic material can be formed by, for example, photolithography.

Figure 2:
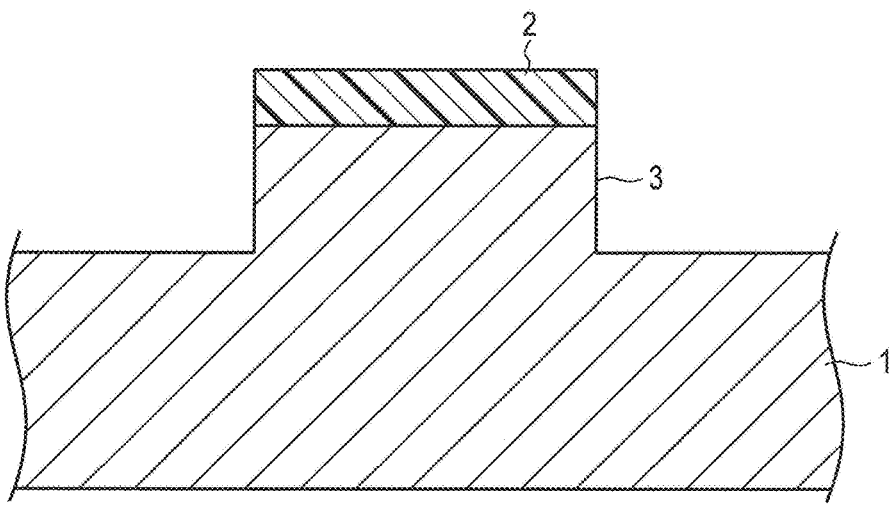
FIG. 2 is a sectional view schematically showing a step of etching the surface of a semiconductor substrate using the first mask layer as an etching mask in the etching method according to the embodiment.

Then, the semiconductor substrate 1 is etched using the first mask layer 2 as an etching mask, as shown in FIG. 2.

When the semiconductor substrate 1 is etched, a projection 3 is formed on the surface of the semiconductor substrate 1.

The etching is, for example, dry etching. The dry etching includes plasma etching using gas of $SF_6$, $CF_4$, $C_2F_6$, $C_3F_8$, $CClF_2$, $CCl_4$, $PCl_3$, $CBrF_3$, or the like.

The height $h_1$ of the projection 3 is preferably within a range of 0.001 μm to 1 μm, and more preferably within a range of 0.15 μm to 0.5 μm. If the height $h_1$ is too small, noble metal elements are diffused into the region of the semiconductor substrate 1 that is located right under a third mask layer 4 (described later) when a catalyst layer (described later) is formed. Therefore resulting in readily progress of etching in a direction crossing the thickness direction of the semiconductor substrate 1. Thought the upper limit of the height $h_1$ is not particularly limited, the height $h_1$ is usually 10 μm or less.

Note that the "height $h_1$" is a value obtained by the following method. First, an image of the section of the semiconductor substrate 1 including the projection 3 is picked up by a scanning electron microscope (SEM) under a magnification within a range of 10,000 to 100,000×. Then, the height of the projection 3 in the image is measured. Specifically, the height of the left sidewall of the projection 3 and that of the right sidewall thereof are measured. When the heights of the left and right sidewalls are the same, the height of one of the sidewalls is defined as "height $h_1$." When they are different, the height of a lower sidewall is defined as "height $h_1$."

Figure 3:
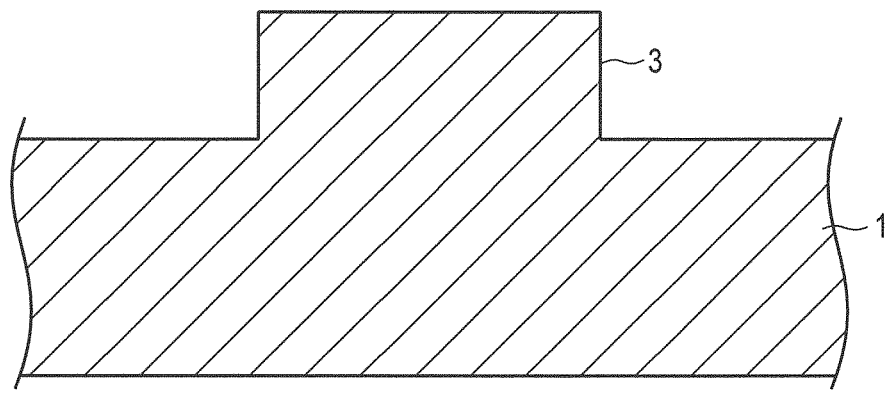
FIG. 3 is a sectional view schematically showing a step of removing the first mask layer in the etching method according to the embodiment.
Figure 4:
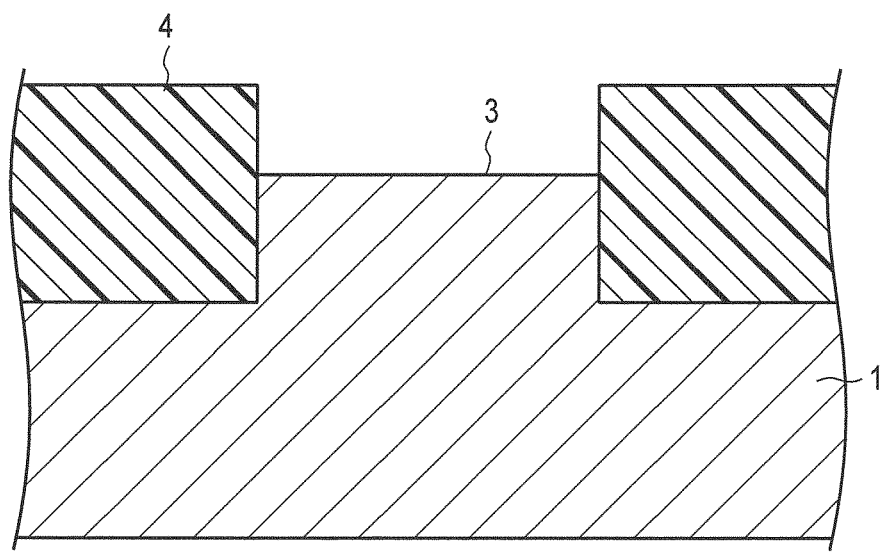
FIG. 4 is a sectional view schematically showing a step of forming a third mask layer in the etching method according to the embodiment.

Then, the first mask layer 2 is removed as shown in FIG. 3. Then, a third mask layer 4 is formed on the surface of the semiconductor substrate 1 as shown in FIG. 4.

The third mask layer 4 has an opening in a position corresponding to the projection 3. For example, the dimensions and shape of the opening are equal to those of the top surface of the projection 3. The third mask layer 4 has a top surface that is flush with or higher than the top surface of the projection 3.

The third mask layer 4 is etching-resistant to an etchant for etching the semiconductor substrate 1.

Any material can be used as the material of the third mask layer 4. Examples of the material include organic materials such as polyimide, a fluorine resin, a phenolic resin, an acrylic resin and a novolak resin and inorganic materials such as silicon oxide and silicon nitride.

The third mask layer 4 can be formed by, for example, the existing semiconductor processes. The third mask layer 4 made of an organic material can be formed by, for example, photolithography. The third mask layer 4 made of an inorganic material can be formed by, for example, depositing an inorganic material layer by vapor phase deposition, forming a mask by photolithography and patterning the inorganic material layer by etching. Alternatively, the third mask layer 4 made of an inorganic material can be formed by oxidizing or nitriding of the surface region of the semiconductor substrate 1, forming a mask by photolithography and patterning of the oxide or nitride layer by etching.

The thickness t3 of the third mask layer 4 is preferably within a range of 0.001 μm to 10 μm, and more preferably within a range of 0.1 μm to 1 μm.

Note that the "thickness $t_3$" is a value obtained by the following method. That is, the thickness $t_3$ of the third mask layer 4 is the distance from the top surface of the third mask layer 4 to the undersurface thereof in the image whose section is parallel to the direction of the thickness and is observed by the microscope.

The ratio $t_3/h_1$ of the thickness $t_3$ of the third mask layer 4 to the height $h_1$ of the projection 3 is preferably 1 or more and more preferably 1.5 or more. When the ratio $t_3/h_1$ is less than 1, a catalyst layer (described later) is formed on the sidewalls of the projection 3 as well as on the top surface thereof. The portion of the catalyst layer that is located on the sidewalls of the projection 3 is likely to inhibit the catalyst layer from moving in the thickness direction of the semiconductor substrate 1 during the process of etching the semiconductor substrate 1. Thus make it difficult to make progress in etching. When the ratio $t_3/h_1$ is 1 or more, the third mask Layer 4 can prevent the catalyst layer from adhering to the sidewalls of the projection 3. Though the upper limit of the ratio $t_3/h_1$ is not particularly limited, it is usually 5 or less.

The width of the opening of the third mask layer 4 (i.e., the width of the projection 3) is preferably within a range of 0.3 μm to 80 μm, and more preferably within a range of 1 μm to 20 μm. If the projection 3 is too wide, it is likely that the number of semiconductor chips that can be produced from a single semiconductor substrate 1 will be reduced when the etching method is used to cut a semiconductor substrate into semiconductor chips. If the projection 3 is too narrow, an etchant (described later) cannot easily reach the surface of the semiconductor substrate 1.

Figure 5:
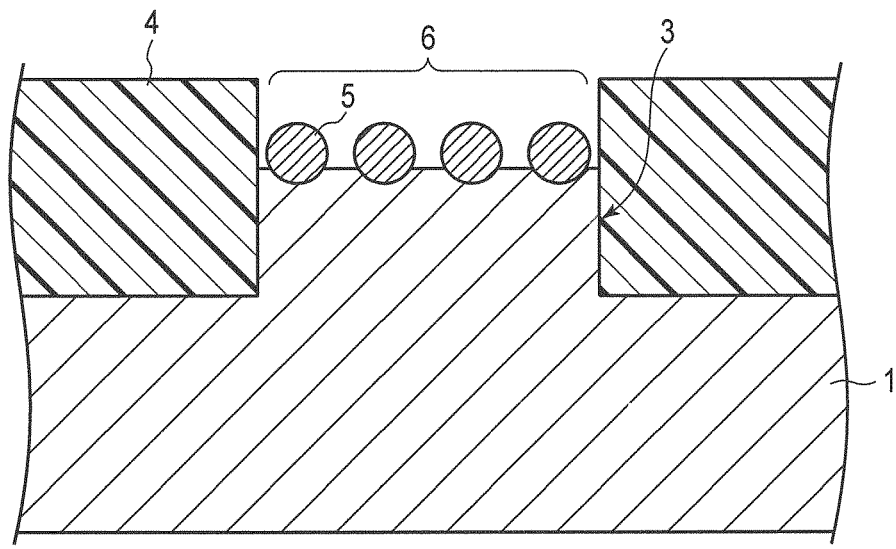
FIG. 5 is a sectional view schematically showing a step of forming a catalyst layer in the etching method according to the embodiment.

Subsequently, a catalyst layer 6 including a noble metal is formed on the top surface of the projection 3 as shown in FIG. 5. The catalyst layer 6 includes, for example, noble metal particles 5. The noble metal is, for example, at least one metal selected from the group consisting of Au, Ag, Pt, Pd, Ru and Rh.

The thickness of the catalyst layer 6 is preferably within a range of 0.01 μm to 0.3 μm, and more preferably within a range of 0.05 μm to 0.2 μm. When the catalyst layer 6 is too thick, an etchant 7 (described later) cannot easily reach the semiconductor substrate 1, thus making it difficult to make etching progress. When the catalyst layer 6 is too thin, the ratio of the total surface area of the noble metal particles 5 to the area to be etched is too small, thus making it difficult to make etching progress. Note that the thickness of the catalyst layer 6 is the distance from the top surface of the catalyst layer 6 to the top surface of the projection 3 in the image of a section that is parallel to the thickness direction of the catalyst layer 6. The image is an image observed by the microscope.

The catalyst layer 6 covers at least a part of the top surface of the projection 3. The catalyst layer 6 may include a discontinuous portion.

The noble metal particles 5 are preferably spherical. The noble metal particles 5 may be in any other shape such as a rod and a plate. The noble metal particles 5 serves as a catalyst for the oxidation reaction of the surface of a semiconductor that is in contact with the noble metal particles 5.

The diameter $d_1$ of each of the noble metal particles 5 is preferably within a range of 0.001 μm to 1 μm, and more preferably within a range of 0.01 μm to 0.5 μm.

Note that the "diameter $d_1$" is a value obtained by the following method. First, an image of the principal surface of the catalyst layer 6 is picked up by the scanning electron microscope (SEM) under a magnification within a range of 10,000 to 100,000×. Then, the area of each of the noble metal particles 5 is obtained from the image. Assuming that each of the noble metal particles 5 is spherical, the diameter of each of the noble metal particles 5 is obtained from the area. This diameter is defined as "diameter $d_1$" of the noble metal particles 5.

The catalyst layer 6 can be formed by electroplating, reduction plating, displacement plating or the like. The catalyst layer 6 can be formed by coating a dispersion containing the noble metal particles 5, or vapor phase deposition such as evaporation and sputtering. Of these methods, the displacement plating is particularly preferable because the noble metal can be deposited directly and uniformly on the projection 3. As one method of forming the catalyst layer 6, the displacement plating will be described below.

For the deposition of a noble metal by the displacement plating, it is possible to use an aqueous solution of tetrachloroaurate (III) acid, a silver nitrate solution, or the like. Below is a description of an example of this process.

The displacement plating solution is, for example, a mixture of an aqueous solution of hydrogen tetrachloroaurate (III) tetrahydrate, and hydrofluoric acid. The hydrofluoric acid has a function of removing a native oxide film from the surface of the semiconductor substrate 1.

When the semiconductor substrate 1 is immersed in the displacement plating solution, a native oxide film is removed from the surface of the semiconductor substrate 1, and a noble metal, i.e. gold in this example, is deposited on the top surface of the projection 3. Consequently, the catalyst layer 6 is obtained.

The concentration of hydrogen tetrachloroaurate (III) tetrahydrate in the displacement plating solution is preferably within a range of 0.0001 mol/L to 0.01 mol/L. Also, the concentration of hydrofluoric acid in the displacement plating solution is preferably within a range of 0.1 mol/L to 6.5 mol/L.

The displacement plating solution may further include a sulfur containing complexing agent. Alternatively, it may further include glycine and citric acid.

Figure 6:
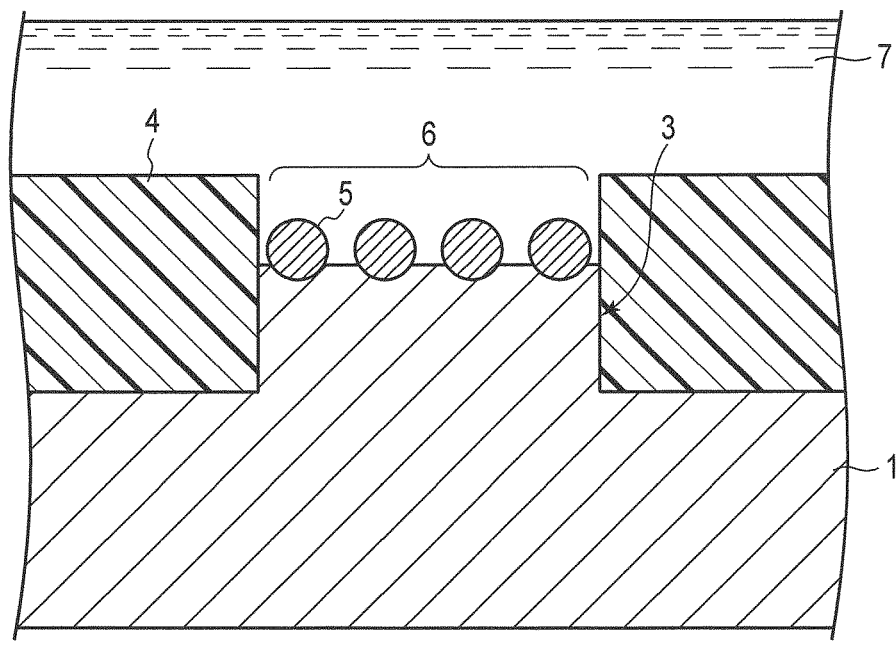
FIG. 6 is a sectional view schematically showing an state at the start of an etching step in the etching method according to the embodiment.

Then, an etchant 7 is supplied to the catalyst layer 6 as shown in FIG. 6. For example, the semiconductor substrate 1 on which the projection 3, third mask layer 4 and catalyst layer 6 are formed is immersed in the etchant 7. The etchant 7 includes, for example, a corrosive agent and an oxidizer. The etchant 7 may also include ammonium fluoride.

Figure 7:
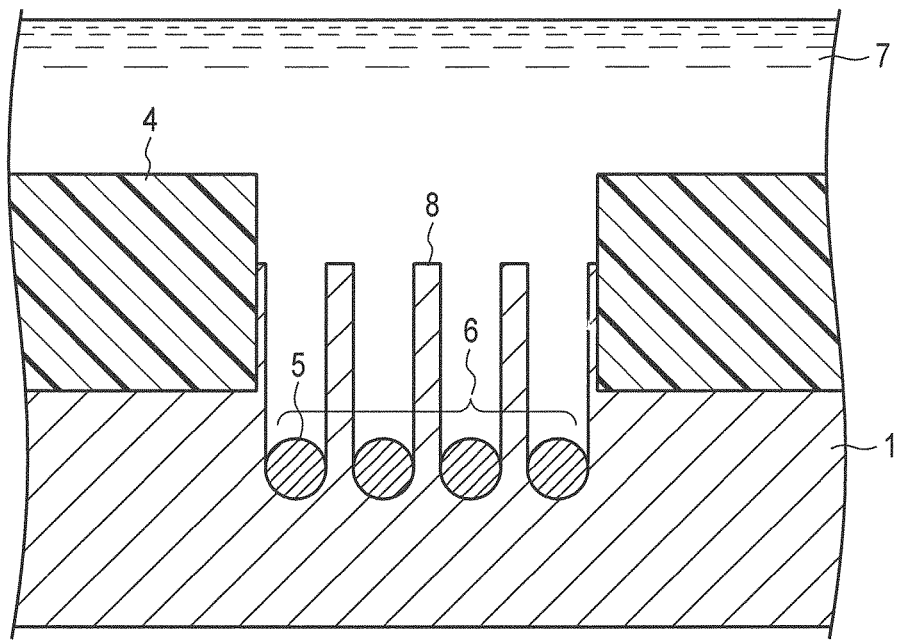
FIG. 7 is a sectional view schematically showing a state after a certain period of time from the state shown in FIG. 6.

When the etchant 7 is brought into contact with the surface of the semiconductor substrate 1, a portion of the surface to which the noble metal particles 5 are close is oxidized by the oxidizer and the oxide is dissolved away by the corrosive agent. As shown in FIG. 7, therefore, the etchant 7 etches the surface of the semiconductor substrate 1 in the vertical direction (i.e. the thickness direction described above) with an assist from the catalyst layer 6 as a catalyst.

The corrosive agent dissolves the oxide. The oxide is, for example, $SiO_2$. The corrosive agent is, for example, hydrofluoric acid.

The concentration of hydrogen fluoride in the etchant 7 is preferably within a range of 0.4 mol/L to 20 mol/L, more preferably within a range of 0.8 mol/L to 16 mol/L, and most preferably within a range of 2 mol/L to 10 mol/L. When the concentration of hydrogen fluoride is too low, a high etching rate is difficult to achieve. When it is too high, controllability of etching in the processing direction (e.g. the thickness direction of the semiconductor substrate 1) may lower.

The oxidizer in the etchant 7 can be selected from, for example, hydrogen peroxide, nitric acid, $AgNO_3$, $KAuCl_4$, $HAuCl_4$, $K_2PtCl_6$, $H_2PtCl_6$, $Fe(NO_3)_3$, $Ni(NO_3)_2$, $Mg(NO_3)_2$, $Na_2S_2O_8$, $K_2S_2O_8$, $KMnO_4$ and $K_2Cr_2O_7$. Hydrogen peroxide is favorable as the oxidizer because it neither forms any harmful byproduct nor contaminates a semiconductor element.

The concentration of the oxidizer such as hydrogen peroxide in the etchant 7 is preferably within a range of 0.2 mol/L to 8 mol/L, more preferably within a range of 0.5 mol/L to 5 mol/L, and most preferably within a range of 0.5 mol/L to 4 mol/L. When the concentration of oxidizer is too low, a high etching rate is difficult to achieve. When it is excessively high, excess side etching may occur.

Note that the foregoing etching method may generate needle-like residual portions 8.

The needle-like residual portions 8 may be removed by, for example, at least one of the wet etching and dry etching. The etchant in the wet etching can be selected from a mixture of hydrofluoric acid, nitric acid and acetic acid, tetramethylammonium hydroxide (TMAH), KOH and the like. The dry etching includes plasma etching using gas of $SF_6$, $CF_4$, $C_2F_6$, $C_3F_8$, $CClF_2$, $CCl_4$, $PCl_3$, $CBrF_3$, or the like.

Note that the etchant 7 may be supplied to the catalyst layer 6 after the third mask layer 4 is removed.

According to the method shown in FIGS. 1 to 7, the semiconductor substrate 1 is etched as described above.

Incidentally, when a semiconductor substrate having no uneven structure including the foregoing projection is etched, porous residual portion tends to be generated. This will be described below.

Figure 8:
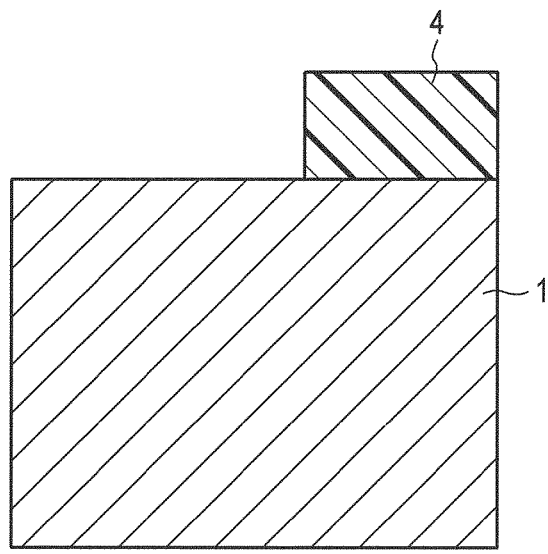
FIG. 8 is a sectional view schematically showing a semiconductor substrate to be etched in a comparative example.

In an etching method according to a comparative example, first, a structure including a semiconductor substrate 1 having a third mask layer 4 but no projection 3 is prepared as shown in FIG. 8.

Figure 9:
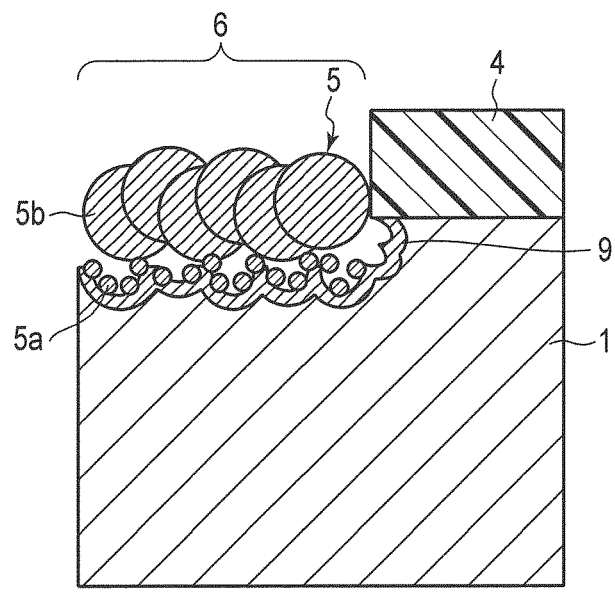
FIG. 9 is a sectional view schematically showing a step of forming a catalyst layer in the comparative example.

Then, as shown in FIG. 9, the foregoing displacement plating is applied to the structure shown in FIG. 8 to form a catalyst layer 6 on the surface of the semiconductor substrate 1. The catalyst layer 6 includes noble metal particles 5. The noble metal particles 5 include noble metal nanoparticles 5a and noble metal particles 5b. When the catalyst layer 6 is formed on the surface of the semiconductor substrate 1, noble metal elements are diffused into the semiconductor substrate 1. The portions of the semiconductor substrate 1 which include the diffused noble metal elements are defined as noble metal diffused portions 9. The noble metal diffused portions 9 are formed in a portion located right under the third mask layer 4 as well as the portion of a surface region of the semiconductor substrate 1 which corresponds to an opening of the third mask layer 4. At least a part of the noble metal particles 5 are also present in a portion located right under the third mask layer 4.

Figure 10:
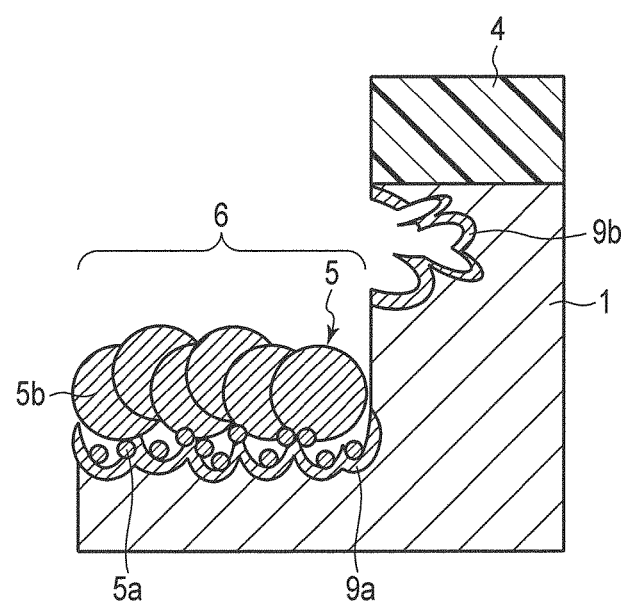
FIG. 10 is a sectional view schematically showing an etching step in the comparative example.

Then, a structure shown in FIG. 9 is etched as shown in FIG. 10. As the etching progresses, the noble metal particles 5 and the noble metal diffused portion 9a of the noble metal diffused portions 9 which corresponds to the opening of the third mask layer 4 move in the thickness direction of the semiconductor substrate 1. On the other hand, the noble metal diffused portion 9b of the noble metal diffused portions 9 which is located right under the third mask layer 4 moves in a direction crossing the thickness direction as the etching progresses. As a result, a plurality of holes that extend in the direction crossing the thickness direction are formed in the portion of the surface region of the semiconductor substrate 1 which is located right under the third mask layer 4.

As described above, when a semiconductor substrate having no uneven structure including a projection is etched, the porous residual portion tends to be generated.

On the other hand, according to the etching method described with reference to FIGS. 1 to 7, the porous residual portion would not be generated. The present inventors consider the reason for this as follows.

First, a structure shown in FIG. 11 is obtained by the method described with reference to FIGS. 1 to 4. FIG. 11 shows a semiconductor substrate 1 on which a projection 3 and a third mask layer 4 are formed.

Then, a structure shown in FIG. 12 is obtained by the method described with reference to FIG. 5. FIG. 12 shows a semiconductor substrate 1 on which a projection 3, a third mask layer 4 and a catalyst layer 6 are formed. The catalyst layer 6 includes noble metal particles 5. The noble metal particles 5 include noble metal nanoparticles 5a and noble metal particles 5b. Also, the semiconductor substrate 1 includes the noble metal diffused portion 9 described above.

The noble metal diffused portion 9 is formed in the portion of the surface region of the semiconductor substrate 1 which corresponds to the opening of the third mask layer 4 and is not easily formed in a portion located right under the third mask layer 4. This is because the top surface of the projection 3 and the undersurface of the third mask layer 4 are fully separated from each other.

Then, when the structure shown in FIG. 12 is etched by the method described with reference to FIGS. 6 and 7, a structure shown in FIG. 13 is obtained. As the etching progresses, the catalyst layer 6 moves in the thickness direction of the semiconductor substrate 1. Since the noble metal diffused portion 9 is hardly present in the portion of the semiconductor substrate 1 which is located right under the third mask layer 4, etching does not easily progress in the portion.

Thus, a plurality of holes extending in a direction crossing the thickness direction in the semiconductor substrate 1 are harder to form in the etching method described with reference to FIGS. 1 to 7 than in the etching method in the comparative example.

According to the etching method of the embodiment, therefore, the porous residual portion would not be generated.

Below is a description of another example of a method of forming an uneven structure including a projection 3 on the surface of the semiconductor substrate 1.

First, as shown in FIG. 14, a semiconductor substrate 1 is prepared and a second mask layer 10 is formed on the surface of the semiconductor substrate 1. The second mask layer 10 is a layer to form a semiconductor layer 11 (described later) on the surface of the semiconductor substrate 1. The second mask layer 10 has at least one opening.

Any material can be used as the material of the second mask layer 10, provided that the material is sufficiently resistant to the deposition process of the semiconductor layer 11 (described later).

The material of the second mask layer 10 is SiN, $SiO_2$, Al or the like. The material of the second mask layer 10 may be the same as that of the foregoing third mask layer 4.

Then, as shown in FIG. 15, a semiconductor layer 11 is formed on the region of the surface of the semiconductor substrate 1 at the opening of the second mask layer 10. The semiconductor layer 11 is, for example, formed all over the opening of the second mask layer 10. The semiconductor layer 11 corresponds to the foregoing projection 3.

The semiconductor substrate 11 is made of, for example, a semiconductor. The semiconductor may be one as described with reference to FIG. 1. The material of the semiconductor 11 may be the same as that of the semiconductor substrate 1 and may be different therefrom if it can be etched under the etching conditions for etching the semiconductor substrate 1.

The semiconductor substrate 11 can be formed by, for example, epitaxial growth. As one example, the semiconductor substrate 11 can be formed by epitaxial growth of silicon.

Then, as shown in FIG. 16, the second mask layer 10 is removed to form a third mask layer 4. Note that the second mask layer 10 may not be removed and can be used as the third mask layer 4.

Another example of a method of forming an uneven structure including a projection 3 on the surface of the semiconductor substrate 1 has been so far described.

The foregoing etching method can be used to manufacture a variety of articles. The etching method can also be used to form a recess or a through hole or to divide a structure such as a semiconductor wafer. For example, the etching method can be used to manufacture a semiconductor device.

An example of a method of manufacturing a semiconductor chip which includes singulating a semiconwafer into a plurality of semiconductor chips by etching the semiconductor wafer, will be described with reference to FIGS. 17 to 26.

Figure 17:
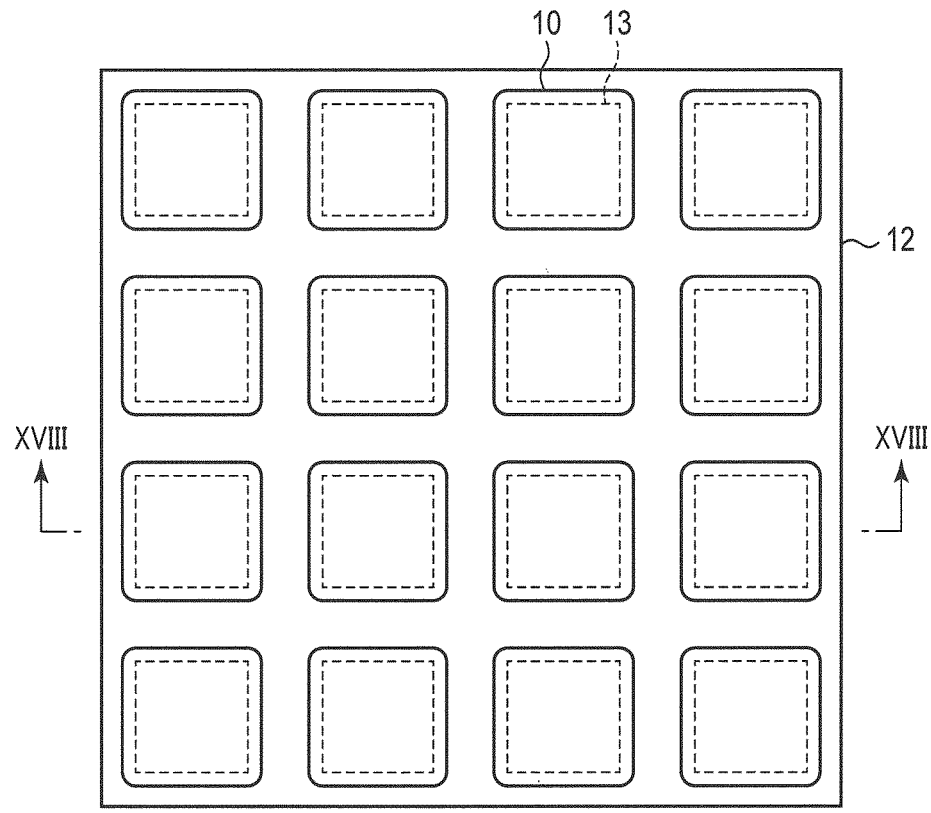
FIG. 17 is a plan view schematically showing a semiconductor wafer used in a semiconductor chip manufacturing method according to the embodiment.
Figure 18:
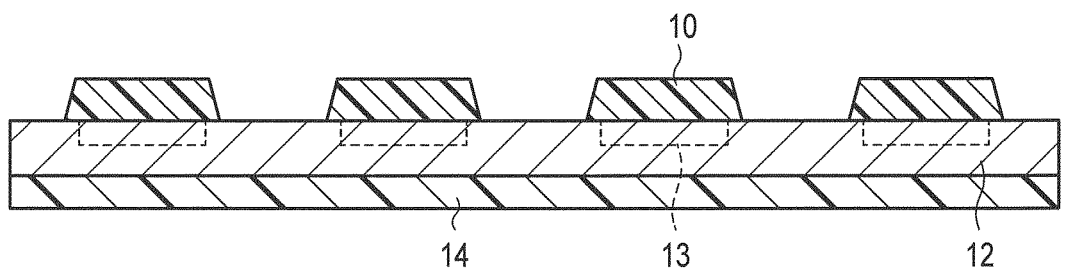
FIG. 18 is a sectional view of the semiconductor wafer, taken along a line XVIII-XVIII shown in FIG. 17.

First, a structure shown in FIGS. 17 and 18 is prepared. This structure includes a semiconductor wafer 12, a second mask layer 10 and a dicing sheet 14. Semiconductor element regions 13 are formed on the surface of the semiconductor wafer 12. The semiconductor element region 13 is a region in which semiconductor elements are formed. The second mask layer 10 covers the semiconductor regions 13 and serves to protect the semiconductor elements against damage. The dicing sheet 11 is adhered to a surface of the semiconductor wafer 12, which is opposite to the surface on which the second mask layer 10 is formed.

Then, as shown in FIGS. 19 and 20, a semiconductor layer 11 is formed on the surface of the semiconductor wafer 12 by the method described with reference to FIG. 15.

Then, as shown in FIGS. 21 and 22, the second mask layer 10 is removed to form a third mask layer 4 by the method described with reference to FIG. 16.

Then, as shown in FIGS. 23 and 24, a catalyst layer 6 including noble metals is formed on the surface of the semiconductor wafer 12 by the method described with reference to FIG. 5.

Then, the structure shown in FIGS. 23 and 24 is etched by the method described with reference to FIGS. 6 and 7 to obtain the structure shown in FIGS. 25 and 26. The etching is performed until the bottom surface of a recess generated by the etching reaches the surface of the dicing sheet 14.

As described above, the foregoing method makes it possible to obtain semiconductor chips 15 each including a semiconductor element region 13 as shown in FIGS. 25 and 26.

In this method, the shape of the upper surface of each semiconductor chip is not limited to a square or rectangle. For example, the upper surface shape of each semiconductor chip may also be a circle or hexagon. Furthermore, this method makes it possible to simultaneously form semiconductor chips having different upper surface shapes.

An example and a comparative example will be described below.

Example

A projection, a third mask layer and a catalyst layer were formed on a semiconductor wafer and the semiconductor wafer was etched by the following method. Then, whether the porous residual portion was generated or not was investigated.

In this method, the semiconductor wafer was singulated into semiconductor chips. This singulation was performed such that the volume of a portion to be removed from the semiconductor wafer was 5% of the entire volume of the semiconductor wafer.

Specifically, first, a first mask layer was formed on the surface of the semiconductor wafer. The first mask layer was formed by photolithography using photoresist. Openings were formed like a grid in the first mask layer, and the width of each of the openings was 1 μm.

Then, a projection was formed on the semiconductor wafer by dry etching using the first mask layer as an etching mask. The height of the projection was 0.2 μm.

Then, the first mask layer was removed, and a third mask layer was formed on the semiconductor wafer. The third mask layer had openings located at the position of the projection. The openings were formed such that its dimensions and shape were equal to those of the top surface of the projection. The third mask layer was also formed such that its top surface was flush with that of the projection. FIG. 27 shows a result obtained by observing the semiconductor wafer on which the projection and the third mask layer are formed. The result was obtained by the scanning electron microscope.

FIG. 27 is a micrograph showing a section of a semiconductor substrate on which a projection and a third mask layer are formed. As shown in FIG. 27, the top surface of the third mask layer and that of the projection are flush with each other.

Then, a plating solution A of 50 mL including an aqueous solution of hydrogen tetrachloroaurate (III) tetrahydrate and hydrofluoric acid was prepared.

Then, a semiconductor wafer on which projections and a third mask layer are formed was immersed in the plating solution A at room temperature for 60 seconds to form a catalyst layer on the top surface of the projections. The immersion was performed without rotating the semiconductor wafer. FIG. 28 shows a result obtained by observing the semiconductor wafer on which the catalyst layer is formed. The result was obtained by the scanning electron microscope. FIG. 28 is a micrograph showing a section of a structure obtained by forming a catalyst layer in the structure shown in FIG. 27.

Figure 29:
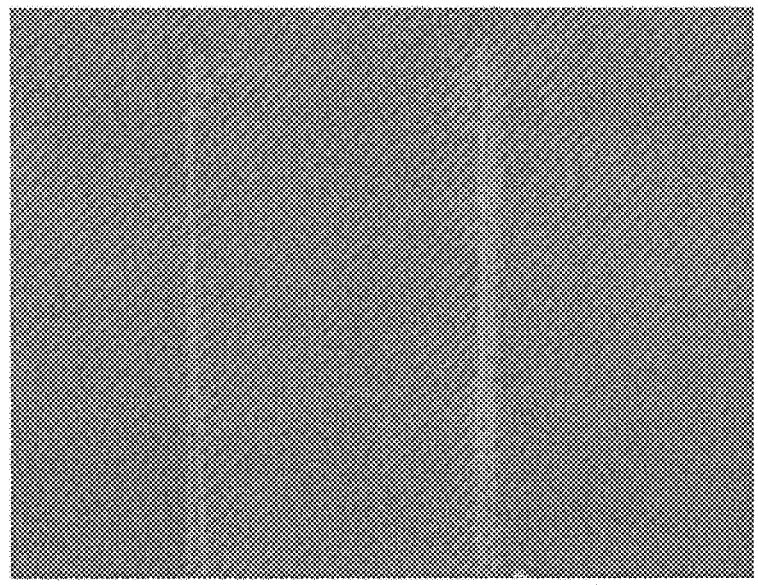
FIG. 29 is a micrograph showing a section of a structure obtained by etching the structure shown in FIG. 28.

Then, hydrofluoric acid of 27.5 mL, hydrogen peroxide of 8.6 mL and water of 63.9 mL were mixed to obtain an etchant of 100 mL. The semiconductor wafer on which the projection, third mask layer and catalyst layer were formed was immersed in the etchant at 25° C. for 30 minutes and etched. FIG. 29 shows a result obtained by observing the etched semiconductor wafer by the scanning electron microscope.

FIG. 29 is a micrograph showing a section of a structure obtained by etching the structure shown in FIG. 28. As shown in FIG. 29, according to the etching method of the above example, the porous residual portion was not generated.

Comparative Example

Except that the projection was not formed on a semiconductor wafer, a third mask layer and a catalyst layer were formed on a semiconductor substrate and the semiconductor substrate was etched by the same method as the etching method described in the foregoing example.

Figure 30:
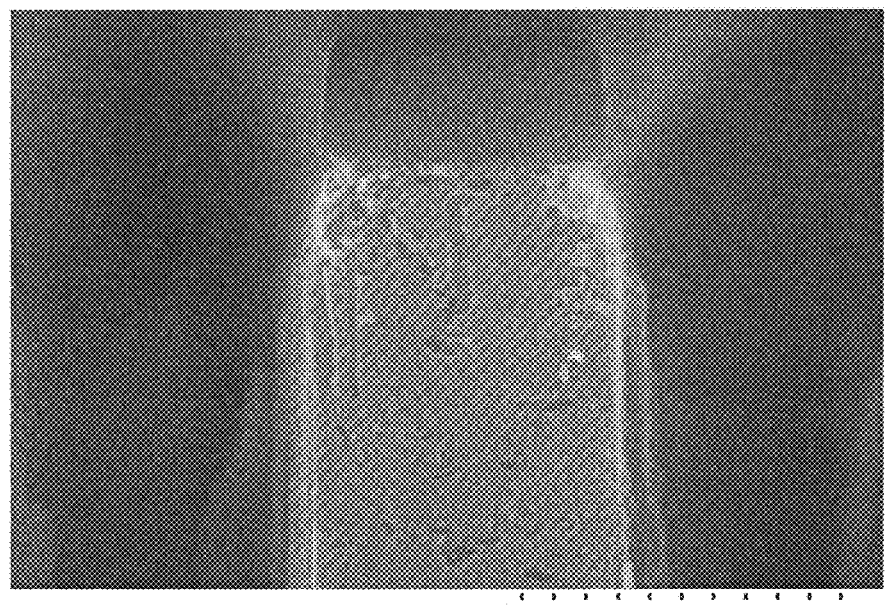
FIG. 30 is a micrograph showing a section of a structure obtained by etching a semiconductor wafer having no uneven structure including a projection.

FIG. 30 is a micrograph showing a section of a structure obtained by etching a semiconductor wafer having no uneven structure including a projection. As shown in FIG. 30, the porous residual portions of the semiconductor were generated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An etching method comprising:
forming an uneven structure including a projection on a surface of a semiconductor substrate;

forming a catalyst layer including a noble metal on the surface selectively at a top surface of the projection; and supplying an etchant to the catalyst layer to cause an etching of the semiconductor substrate with an assist from the noble metal as a catalyst, wherein the forming of the uneven structure includes:

forming a first mask layer having an opening on the surface;

etching the surface using the first mask layer as an etching mask; and removing the first mask layer.

2. An etching method comprising:

forming an uneven structure including a projection on a surface of a semiconductor substrate;

forming a catalyst layer including a noble metal on the surface selectively at a top surface of the projection; and supplying an etchant to the catalyst layer to cause an etching of the semiconductor substrate with an assist from the noble metal as a catalyst, wherein the forming of the uneven structure includes:

forming a second mask layer having an opening on the surface; and forming a semiconductor layer on the surface at the opening.

3. The etching method according to claim 2, wherein the semiconductor layer is formed by epitaxial growth.

4. The etching method according to claim 1, wherein the forming of the catalyst layer is performed in a presence of a third mask layer, the third mask layer opening at the projection and having a top surface that is flush with or higher than the top surface of the projection.

5. The etching method according to claim 4, wherein the supplying of the etchant to the catalyst layer is performed with the third mask layer left on the semiconductor substrate.

6. The etching method according to claim 5, wherein the third mask layer is more etching-resistant to the etchant than the projection.

7. The etching method according to claim 1, wherein the etchant includes a corrosive agent and an oxidizer.

8. The etching method according to claim 7, wherein the corrosive agent includes hydrofluoric acid, and the oxidizer includes at least one of hydrogen peroxide, nitric acid, $AgNO_3$, $KAuCl_4$, $HAuCl_4$, $K_2PtCl_6$, $H_2PtCl_6$, $Fe(NO_3)_3$, $Ni(NO_3)_2$, $Mg(NO_3)_2$, $Na_2S_2O_8$, $K_2S_2O_8$, $KMnO_4$ and $K_2Cr_2O_7$.

9. The etching method according to claim 1, wherein the projection has a height within a range of 0.15 μm to 0.5 μm.

10. The etching method according to claim 1, wherein the noble metal is Au.

11. A method of manufacturing a semiconductor chip, comprising etching a semiconductor wafer by the etching method according to claim 1 to cingulate the semiconductor wafer into semiconductor chips, the surface being a surface of the semiconductor wafer.

12. A method of manufacturing an article, comprising etching the surface by the etching method according to claim 1.

13. The etching method according to claim 1, further comprising forming a third mask layer on the surface of the semiconductor substrate after forming the uneven structure and before forming the catalyst layer, the third mask layer opening at the projection, wherein among the top surface of the projection and the third mask layer, the catalyst layer is selectively formed at the top surface of the projection.

14. A method of manufacturing a semiconductor chip, comprising etching a semiconductor wafer by the etching method according to claim 2 to singulate the semiconductor wafer into semiconductor chips, the surface being a surface of the semiconductor wafer.

15. A method of manufacturing an article, comprising etching the surface by the etching method according to claim 2.

* * * * *